（12） United States Patent
Mishra et al.

(10) Patent No.: US 8,698,546 B1
(45) Date of Patent: Apr. 15, 2014

(54) SWITCH ARCHITECTURE AT LOW SUPPLY VOLTAGES

(71) Applicant: Texas Instruments Incorporated, Dallas, TX (US)

(72) Inventors: Vineet Mishra, New Thippasandra (IN); Rajavelu Thinakaran, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 13/625,609

(22) Filed: Sep. 24, 2012

(51) Int. Cl.
*H03K 17/16* (2006.01)

(52) U.S. Cl.
USPC ............ 327/388; 327/391; 327/437; 326/113

(58) Field of Classification Search
USPC ............... 327/427–438, 379–391, 403, 404, 327/374–377; 326/113
See application file for complete search history.

(56) References Cited

U.S. PATENT DOCUMENTS 7,471,111 B2* 12/2008 Seth et al. ................. 326/83
7,924,085 B2*  4/2011 Guo .......................... 327/534

* cited by examiner

*Primary Examiner* — Lincoln Donovan
*Assistant Examiner* — Thomas Skibinski
(74) *Attorney, Agent, or Firm* — John R. Pessetto; W. James Brady; Frederick J. Telecky, Jr.

(57) ABSTRACT

A sampled CMOS switch includes first and second NMOS devices in series between input and output nodes. The first and second NMOS devices are activated by a sample signal. A pair of low-voltage DEPMOS devices is connected in a "T" configuration between the input and output nodes. The low-voltage DEPMOS devices are activated by an inverted sample signal. A feedback circuit includes the DEPMOS devices together with a third high-voltage NMOS device and a current source. The third NMOS device is controlled by a signal on the input node. A switch switchably connects an analog voltage source to a source of the third NMOS device and gates of the DEPMOS devices in accordance with a phase of an inverted sample signal. The construction of the sampled CMOS switch enables the protection of the gate oxide insulation of the low-voltage DEPMOS transistors from high voltage damage.

4 Claims, 3 Drawing Sheets

US 8,698,546 B1

SWITCH ARCHITECTURE AT LOW SUPPLY VOLTAGES

BACKGROUND

1. Field

The various circuit embodiments described herein relate in general to electronic switches, and, more specifically, to electronic switch architectures that can operate at low supply voltages.

2. Background

Electronic switches are found in many electronic applications. For example analog-to-digital converters (ADCs), or the like, is one application in which electronic switches are widely used. Many other general applications abound. An example of a complementary metal-oxide semiconductor (CMOS) switch 10 of one type of electronic switch described herein is shown in FIG. 1, to which reference is now made.

The switch 10 includes a p-channel metal-oxide semiconductor MOS (PMOS) device 12 and an n-channel metal-oxide semiconductor (NMOS) device 14. The PMOS device 12 has its source connected to an input node 16 and its drain connected to an output node 18. The gate of the PMOS device 12 is connected to a reference potential, or ground 22. The NMOS device 14 has its drain connected to the input node 16 and its source connected to the output node 18. The gate of the NMOS device 14 is connected to an analog voltage supply source (VDD) 22.

In operation, when the voltage between the input node 16 and ground 20 is above $V_{tp}$ ($V_{tp}$ is the threshold voltage of the PMOS device 12), the PMOS device 12 will conduct. Similarly, when the voltage between VDD 22 and the input node 16 is above the threshold voltage $V_{tn}$ of the NMOS device 14, the NMOS device 14 will conduct.

One of the conditions that is often encountered is a high rail-to-rail signal voltage. A high supply range between 1.7 V and 3.6 V must be supported in many applications. However, the case of a CMOS switch, the threshold voltage of the PMOS device 12 plus the threshold voltage of the NMOS device 14 ($V_{tp}+V_{tn}$) may be higher than the difference in voltage between VDD and ground. As a result, a large switch area may be required. Another condition that may be encountered in some applications is that a supply boost switch may be unusable due to a very large clock time period, or a unavailable usable clock signal.

In many applications, the switch may be operated with a sampling signal, such as, for instance, in the example CMOS switch circuit 30 shown in FIG. 2, to which reference is now additionally made. The CMOS switch circuit 30 includes an NMOS device 34 and a PMOS device 36 between the input node 38 and output node 40. A variable voltage 32 is applied to the input node 38. The sampling signal (SAMP) is applied to the gate of the NMOS device 34 and an inverted sampling signal (SAMPZ) is applied to the gate of the PMOS device 36. The output from the switch 30 is applied across a capacitor 42 in the output node 40 and connected to an output by a switch 44 that is switched at a sampling frequency.

However, in many applications, for example in analog-to-digital converters (ADCs), a sampling instant 45 may be provided by an off-chip signal that is asynchronous to an internal analog-to-digital (ADC) conversion clock 46. Synchronizing the off-chip asynchronous sampling clock to an internal ADC clock and using that to operate a boost switch can cause a phase delay 48 in sampling, shown in FIG. 3. The phase delay 48 may result in a sampling error and a degraded signal-to-noise ratio (SNR). If the sampling signal is asynchronous to the ADC clock, it may lead to kick-back at the input before sampling.

SUMMARY

An embodiment of a sampled CMOS switch for connection between input and output nodes includes first and second MOS devices in series between input and output nodes of the switch. The first and second NMOS devices are activated by a sample signal. A pair of extended drain MOS devices is connected in a "T" configuration between the input and output nodes. The extended drain MOS devices are activated by an inverted sample signal. In one embodiment, the first and second MOS devices are NMOS devices and the pair of extended drain MOS devices comprises DEPMOS devices. In another embodiment, the DEPMOS devices are a part of a feedback circuit that includes a third NMOS device and a current source connected between an analog voltage source and a reference potential. The third NMOS device is controlled by a signal on the input node. A switch switchably connects an analog voltage source to a source of the third NMOS device and gates of the DEPMOS devices in accordance with a phase of an inverted sample signal.

Another embodiment of a sampled CMOS switch for connection between input and output nodes has first and second NMOS devices in series between the input and output nodes. The first and second NMOS devices are activated by a sample signal to connect the input node to the output node. The sampled CMOS switch has a feedback circuit which includes a pair of DEPMOS devices in a "T" configuration between the input and output nodes. The pair of DEPMOS devices are activated by an inverted sample signal. The low voltage DEPMOS device has a low $V_t$ that solves the problem of $V_{tp}+V_{tn}$>VDD–GND. However due to the gate oxide reliability of low voltage DEPMOS devices, it needs to be protected by a third NMOS used in feedback circuit. Thus, the feedback circuit includes the third NMOS device and a current source between an analog voltage source and a reference potential. The third NMOS device is controlled by a signal on the input node. The feedback circuit additionally has a switch to switchably connect an analog voltage source to a source of the third NMOS device and to gates of the DEPMOS devices in accordance with a phase of an inverted sample signal. In one embodiment, the first and second NMOS devices are high voltage devices and the DEPMOS devices are low voltage devices with low threshold voltages. This ensures that the sum of threshold voltage of high voltage NMOS and low voltage DEPMOS ($V_{tp}+V_{tn}$) is less than difference between supply VDD and ground.

A method embodiment for protecting gate oxide insulation of low voltage DEPMOS transistors of a sampled CMOS switch from high voltage damage includes connecting the MOS transistors in series between the input and output nodes. The method also includes connecting a pair of extended drain MOS devices connected in a "T" configuration between the input and output nodes. The pair of extended drain MOS devices are activated by an inverted sample signal. In one embodiment, the first and second MOS transistors are NMOS devices and the pair of extended drain MOS devices comprise DEPMOS devices. In one embodiment of the method, a third high-voltage NMOS device and a current source are connected between an analog voltage source and a reference potential. The third NMOS device is controlled by a signal on the input node. A switch is provided that is operable to switchably connect an analog voltage source to a source of the third NMOS device and gates of the DEPMOS devices in accordance with a phase of the inverted sample signal.

BRIEF DESCRIPTION OF THE DRAWINGS

In the various figures of the drawing, like reference numbers are used to denote like or similar parts.

DETAILED DESCRIPTION

Figure 1:
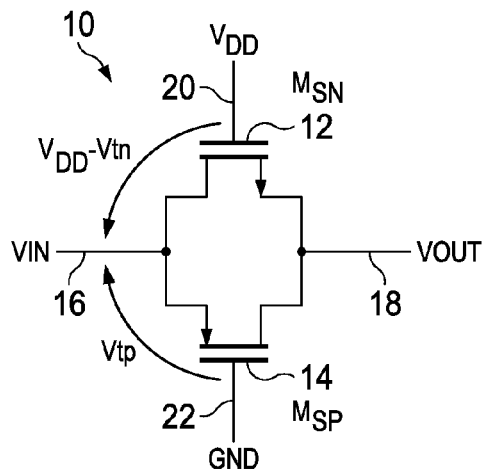
FIG. 1 is an electrical schematic diagram of a typical CMOS switch circuit.
Figure 2:
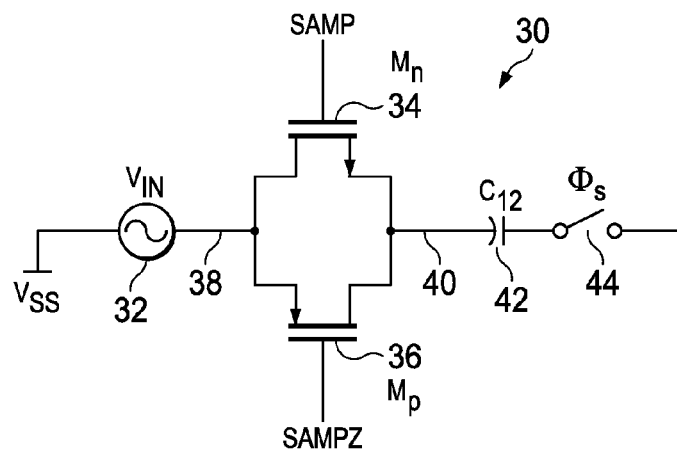
FIG. 2 is an electrical schematic diagram of a typical CMOS switch circuit that employs a sampling signal in its operation.
Figure 3:
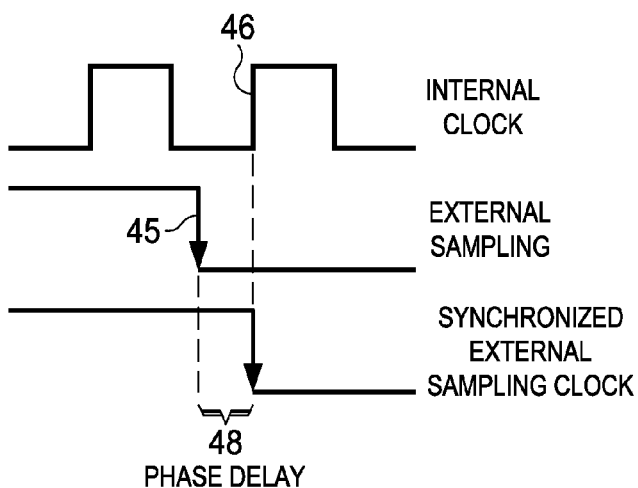
FIG. 3 shows various curves that occur in the operation of the CMOS switch circuit of FIG. 2, illustrating the phase delay in sampling if off-chip sampling is provided asynchronously with an internal clock.
Figure 4:
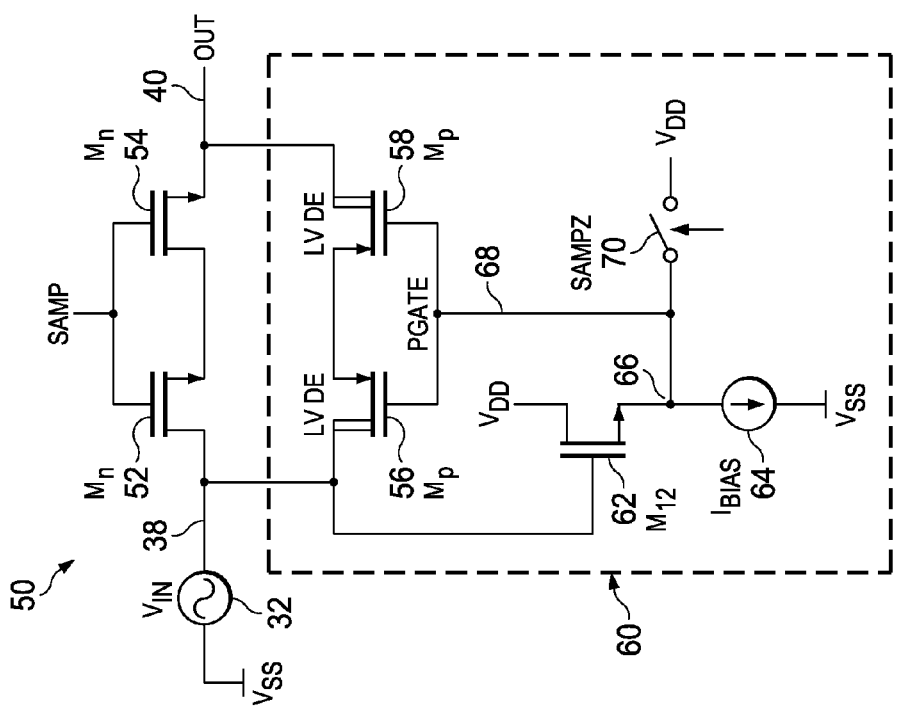
FIG. 4 is an electrical schematic diagram of an example of a CMOS switch circuit that solves some of the shortcomings of the CMOS switch circuits of FIGS. 1 and 2.

One example of a sampled CMOS switch circuit 50 that provides a solution to at least some of the problems of the CMOS switches of FIGS. 2 and 3 is shown in FIG. 4, to which reference is now additionally made. In the sampled CMOS switch circuit 50 of FIG. 4, first and second series connected NMOS switch devices 52 and 54 are connected between the input node 38 and the output node. The first and second NMOS switch devices 52 and 54 may have a threshold voltage.

The sample signal, SAMP, is connected to the gates of the first and second NMOS devices 52 and 54. The sample signal, SAMP, has a value equal to VDD, and operates to turn on the first and second NMOS switch devices 52 and 54 when a positive voltage is applied to their gates.

A pair of series connected, drain-extended p-channel metal-oxide semiconductor (DEPMOS) devices 56 and 58 are connected in a "T" configuration between the input node 38 and the output node 40 as a part of a feedback loop 60. In the "T" configuration, the drain of DEPMOS device 56 is connected to the input node 38, the sources of the DEPMOS devices 56 and 58 are connected together, and the drain of the DEPMOS device 58 is connected to the output node 40. The DEPMOS devices 56 and 58, have a low threshold voltage and may have gate oxide reliability limit less than VDD.

Briefly, a DEPMOS device includes p-type source and drain regions formed on each side of an n-doped channel in an n-well. A voltage drop region is provided in a compensated p-well (CP well) between the n-doped channel and the p-type drain. The CP well inhibits channel hot carrier or direct tunneling degradation of the transistor gate dielectric, especially in high-voltage operations. The voltage drop region has more n-type dopants, or fewer p-type dopants, than the p-wells and shifts any high fields toward the drain and away from the gate dielectric of the device, thereby mitigating damage to or degradation of the gate dielectric. An n-type back gate may also be formed in the n-well to allow coupling of the n-well to a known voltage potential to prevent or inhibit threshold voltage fluctuations in the device.

The DEPMOS devices 52 and 54 may be constructed using techniques similar to those shown in U.S. Pat. No. 7,560,324, entitled DRAIN EXTENDED MOS TRANSISTORS AND METHODS FOR MAKING THE SAME, assigned to the assignee hereof. General principles of operation also are described in copending patent application Ser. No. 12/824, 944, filed Jun. 28, 2010, entitled COMPENSATED ISOLATED P-WELL DENMOS DEVICES, and assigned to the assignee hereof.

Using such DEPMOS devices, a lower total threshold voltage, $V_t$, may be achieved. This addresses the concern described above that the sum of the thresholds of the NMOS devices 52 and 54 and DEPMOS devices 56 and 58 ($V_{tn}+V_{tp}$) may be larger than the value of VDD. This also enables a lower overall switch area to be required for the construction of the device.

The sampled CMOS switch circuit 50 operates, at least in part, using a feedback loop 60. The feedback loop 60 includes a third high voltage NMOS device 62 connected in series with a bias current source 64 between the analog supply voltage, VDD, and a reference potential, or ground. A switch 70 is connected between the gates of the DEPMOS devices 56 and 58 and the analog voltage supply, VDD. The switch 70 is also connected between the gates of the DEPMOS devices 56 and 58 and the node 66 between the source of the third NMOS device 62 and the bias current source, $I_{BIAS}$, 64. The switch 70 is deactivated by a signal representing the phase of the inverted analog sample voltage, SAMPZ, signal, thereby applying an analog voltage equal to the third NMOS threshold voltage below the input voltage 38 ($V_{in}-V_{tnhv}$, to the gates of the DEPMOS devices 56 and 58 to turn them on when the SAMPZ signal is low. It should be noted that the threshold voltage of the third NMOS device 62 is greater than threshold voltage of the DEPMOS devices 58 and 58, as is the case with CMOS processes.

In operation, if the inverted analog sample voltage, SAMPZ, signal is zero and $V_{in}$ is 3.6 V, the gate oxide insulation of the low voltage DEPMOS devices 56 and 58 would face breakdown unless they are protected. Thus, the current source, $I_{BIAS}$, 64 pulls down the node 66, to a voltage equal to $V_{gs}$ of the third NMOS device 62 below $V_{in}$. At that time PGATE=$V_{in}-V_{t(NMOS\,62)}$ and the current in the NMOS device 62 is $I_{BIAS}$. When the input voltage $V_{IN}$ falls below the high voltage $V_t$ of the third NMOS device 62, the third NMOS device 62 is cut-off and the current source, $I_{BIAS}$, 64 clamps the node 66 to ground. $I_{BIAS}$ may be, for example, 1 μA, which is sufficient to follow the signal, since the capacitance of the DEPMOS devices 52 and 54 will aid the follower. The circuit 50 is protected in its off state on the drain side, due to the DEPMOS T-switch.

With the circuit 50 constructed as described above, the problem shifts to $VDD_{min}>V_{t(HV\,NMOS\,52\,or\,54)}+V_{t((LV)DEPMOS\,56\,or\,58)}$. This circuit is thus enabled to pass the entire input signal range with low area for low-speed applications.

Figure 5:
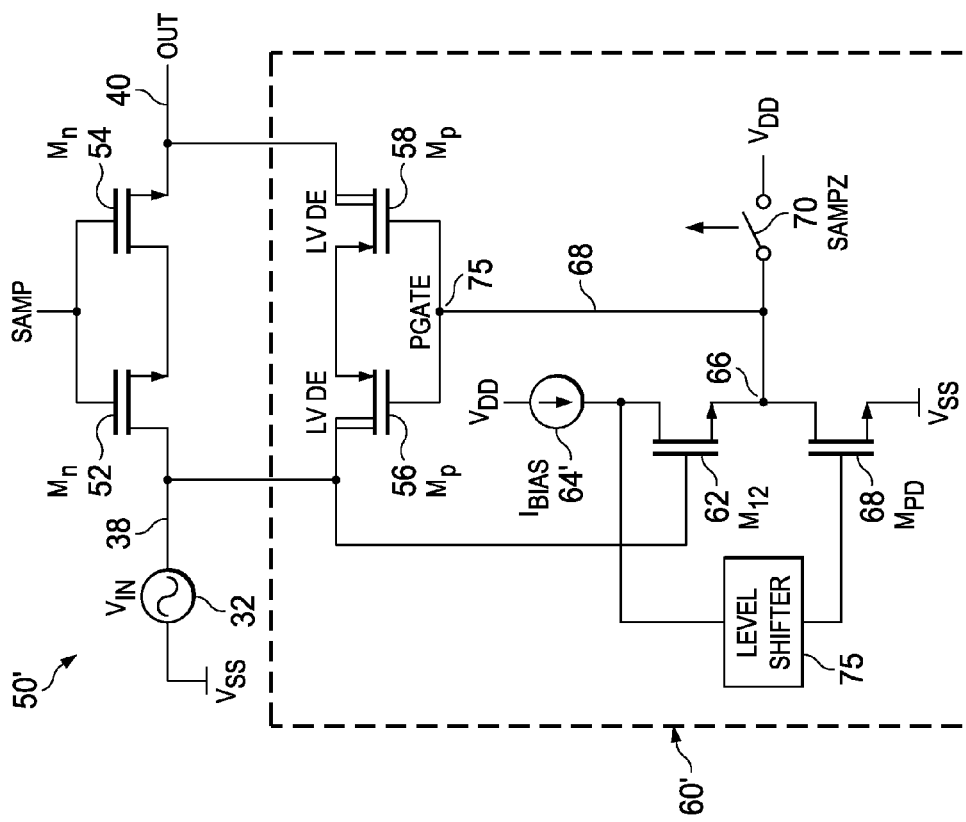
FIG. 5 is an electrical schematic diagram of an example of a CMOS switch circuit having a feedback circuit with dynamic biasing for high-speed sampling applications.

Another circuit embodiment of a sampled CMOS switch circuit 50' is shown in FIG. 5, to which reference is now additionally made. In the sampled CMOS switch circuit 50', the feedback loop 60' includes a fourth NMOS device 68 in series a current bias source, $I_{BIAS}$, 64', between the analog voltage supply, VDD, and a reference potential, $V_{SS}$, or ground. A level shifter 75 is connected between the drain of the third NMOS device 62 and the gate of the fourth NMOS device 68. The sampled CMOS switch circuit 50' can control the time it takes to switch the circuit on; hence, the sampled CMOS switch circuit 50' also enables the sample time to be controlled.

If the sampled CMOS switch circuit 50' is switched on (i.e., the SAMP signal is brought high to sample the input voltage, $V_{IN}$) and the PGATE node is off (i.e., is about 3.6 V), a low $I_{BIAS}$ current may not be able to pull the PGATE node 74 to $V_{IN}-V_{th(NMOS\ 62)}$ because of the large DEPMOS switch capacitance. Consequently, the bias current, $I_{BIAS}$, can be increased to about 100 µA. This will produce a very large quiescent current through the third NMOS devices 62 and the fourth NMOS device 68.

In operation, when PGATE=VDD, the gate of the fourth NMOS device 68 also equals VDD and the NMOS device 62 is cut-off. When SAMPZ goes to zero, the bias current, $I_{BIAS}$, pulls up the gate of the fourth NMOS device 68 that then pulls a large current from node 66 until feedback around the third NMOS device 62 takes over. At that point, PGATE=$V_{IN}-V_{t(HV\ NMOS\ device\ 62)}$ and $I_{(NMOS\ device\ 62)}=I_{(NMOS\ device\ 68)}=I_{BIAS}$. This enables a high-speed sampling operation.

Figure 6:
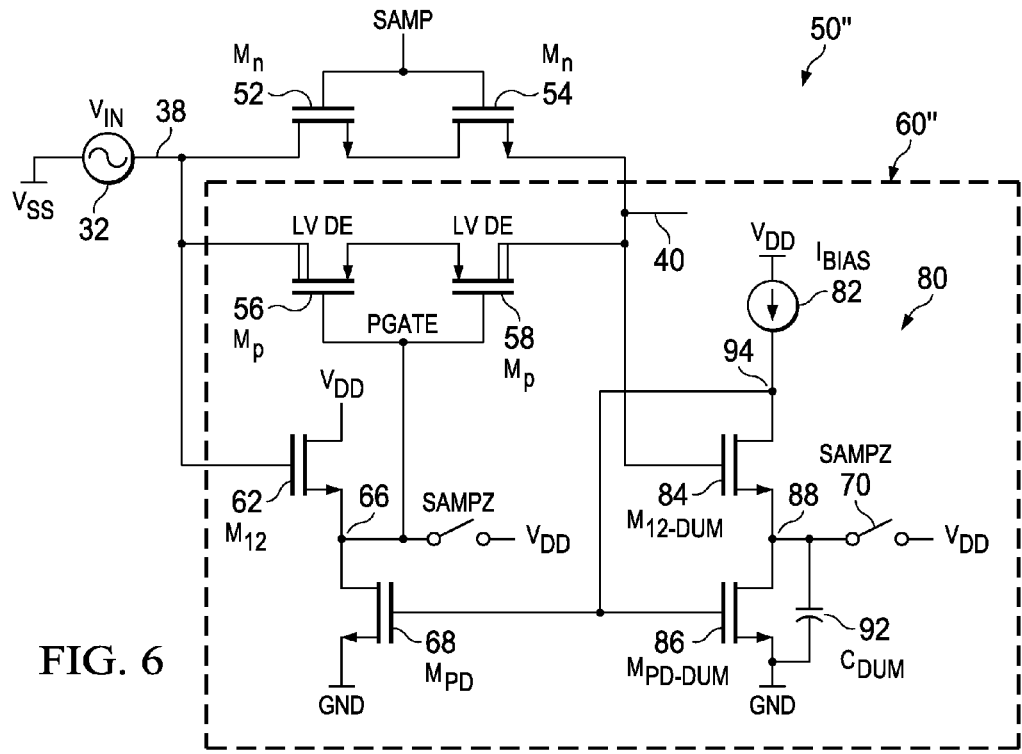
FIG. 6 is an electrical schematic diagram of an example of a CMOS switch circuit having a common dummy circuit for additional reliability.

Another CMOS switch circuit 50" embodiment is shown in FIG. 6, to which reference is now additionally made. The CMOS switch circuit 50" has a replica arm 80 in the feedback circuit 60". The replica arm 80 includes fifth and sixth NMOS devices 84 and 86 in series with a current source 82 between $V_{DD}$ and $V_{SS}$. The gate of the sixth NMOS device 86 is connected to the gate of the fourth NMOS device 68 and to the drain of the fifth NMOS device 84. The sample switch 70, switched in accordance with the phase of the SAMPZ signal, is connected to node 88 between the fifth and sixth NMOS devices 84 and 86. A dummy capacitor 92 is connected between the node 88 and a reference potential, or ground. This enables multiple multiplexed input channels with the same low current replica bias.

The circuit embodiment illustrated in FIG. 6 has good boot-strap reliability. The boot-strap reliability is enabled by the separate PGATE biasing arm produced on node 94 from the feed-back dummy arm. If the PGATE DUM voltage on node 88 charges up faster than PGATE, the scheme may fail, since the remaining pull-up has to be done with only a low $I_{BIAS}$ current. This is addressed by the dummy capacitor 92 in the dummy arm 80. The capacitance of the dummy capacitor 92 is larger than the capacitance of the DEPMOS devices 56 and 58 to replicate the pull-up time-constant.

Figure 7:
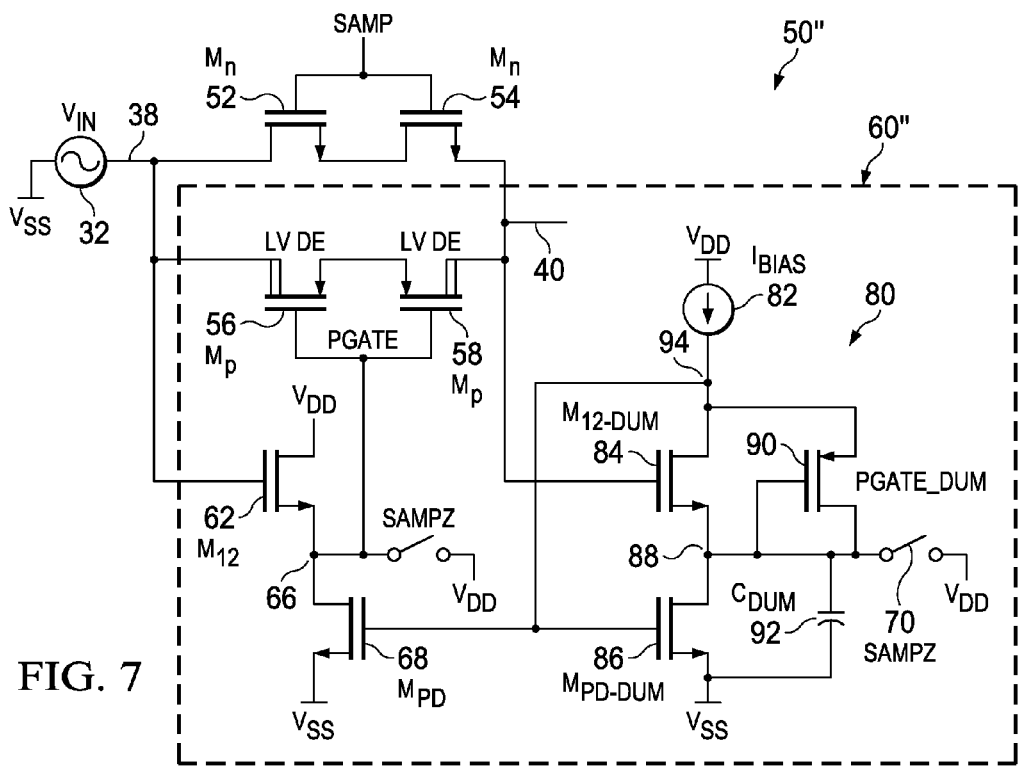
FIG. 7 is an electrical schematic diagram of an example of a CMOS switch circuit having kick-back protection.

In operation, if $V_{IN}=V_{tn}$, then the gate of the sixth NMOS device 86 in the dummy arm 80 will drop very slowly from VDD, and the fifth NMOS device 84 will be barely on. This causes a slow settling component in the PGATE voltage, which kicks-back into $V_{IN}$. This may cause error in the sampled voltage. This may be corrected by adding a diode connected seventh PMOS device 90 in parallel with the source-follower sixth NMOS device 84, as shown in FIG. 7.

Electrical connections, couplings, and connections have been described with respect to various devices or elements. The connections and couplings may be direct or indirect. A connection between a first and second electrical device may be a direct electrical connection or may be an indirect electrical connection. An indirect electrical connection may include interposed elements that may process the signals from the first electrical device to the second electrical device.

Although the invention has been described and illustrated with a certain degree of particularity, it should be understood that the present disclosure has been made by way of example only, and that numerous changes in the combination and arrangement of parts may be resorted to without departing from the spirit and scope of the invention, as hereinafter claimed.

The invention claimed is:

1. A sampled CMOS switch for connection between input and output nodes, comprising:
   first and second MOS devices in series between said input and output nodes, said first and second NMOS devices being activated by a sample signal; and
   a pair of extended drain MOS devices connected in a "T" configuration between said input and output nodes, said pair of extended drain MOS devices being activated by an inverted sample signal;
   wherein said first and second MOS devices are NMOS devices having high threshold voltages and said pair of extended drain MOS devices are low-voltage DEPMOS devices;
   wherein said DEPMOS devices are a part of a feedback circuit further comprising:
   a third high-voltage NMOS device and a current source connected between an analog voltage source and a reference potential, said third NMOS device being controlled by a signal on the input node, and
   a switch operable to switchably connect the analog voltage source to a source of said third NMOS device and gates of the DEPMOS devices in accordance with a phase of the inverted sample signal.

2. A sampled CMOS switch for connection between input and output nodes, comprising:
   first and second MOS devices in series between said input and output nodes, said first and second NMOS devices being activated by a sample signal; and
   a pair of extended drain MOS devices connected in a "T" configuration between said input and output nodes, said pair of extended drain MOS devices being activated by an inverted sample signal;
   wherein said first and second MOS devices are NMOS devices having high threshold voltages and said pair of extended drain MOS devices are low-voltage DEPMOS devices;
   wherein said low-voltage DEPMOS devices are a part of a feedback circuit further comprising:
   a third high-voltage NMOS device, a fourth NMOS device, and a current source between an analog voltage source and a reference potential, said third NMOS device being controlled by a signal on the input node;
   a level shifter connected between a drain of said third NMOS device and a gate of said fourth NMOS device; and
   a switch operable to switchably connect the analog voltage source to a source of the third NMOS device and gates of the DEPMOS devices in accordance with a phase of the inverted sample signal.

3. A method for protecting gate oxide insulation of first and second MOS transistors of a sampled CMOS switch from high voltage damage, comprising:
   connecting said MOS transistors in series between input and output nodes, said first and second MOS devices being activated by a sample signal; and
   connecting a pair of extended drain MOS devices connected in a "T" configuration between said input and output nodes, said pair of extended drain MOS devices being activated by an inverted sample signal;
   wherein said first and second MOS transistors are NMOS devices and said pair of extended drain MOS device are DEPMOS devices;
   connecting a third NMOS device and a current source between an analog voltage source and a reference potential, said third NMOS device being controlled by a signal on the input node, and connecting a switch operable to switchably connect the analog voltage source to a source of the third NMOS device and gates of the DEPMOS devices in accordance with a phase of the inverted sample signal.

4. A method for protecting gate oxide insulation of first and second MOS transistors of a sampled CMOS switch from high voltage damage, comprising:

connecting said MOS transistors in series between input and output nodes, said first and second MOS devices being activated by a sample signal; and connecting a pair of extended drain MOS devices connected in a "T" configuration between said input and output nodes, said pair of extended drain MOS devices being activated by an inverted sample signal;

wherein said first and second MOS transistors are NMOS devices and said pair of extended drain MOS device are DEPMOS devices;

connecting a third NMOS device, a fourth NMOS device, and a current source between an analog voltage source and a reference potential, said third NMOS device being controlled by a signal on the input node;

connecting a level shifter between a drain of said third NMOS device and a gate of said fourth NMOS device; and connecting a switch operable to switchably connect the analog voltage source to a source of the third NMOS device and gates of the DEPMOS devices in accordance with a phase of the inverted sample signal.

* * * * *